US012650769B2

(12) United States Patent
Woo et al.

(10) Patent No.: US 12,650,769 B2
(45) Date of Patent: Jun. 9, 2026

(54) SIMULATION METHOD AND MODELING METHOD

(71) Applicant: Samsung Electronics Co., Ltd., Suwon-si (KR)

(72) Inventors: Honguk Woo, Suwon-si (KR); Seunghwan Jeong, Suwon-si (KR); Jooyoung Park, Suwon-si (KR); Youngseok Lee, Suwon-si (KR)

(73) Assignees: Samsung Electronics Co., Ltd., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 870 days.

(21) Appl. No.: 17/978,377

(22) Filed: Nov. 1, 2022

(65) Prior Publication Data

US 2023/0176957 A1     Jun. 8, 2023

(30) Foreign Application Priority Data

Dec. 3, 2021    (KR) ........................ 10-2021-0172379
May 25, 2022    (KR) ........................ 10-2022-0064245

(51) Int. Cl.
*G06F 3/06* (2006.01)
*G06F 30/27* (2020.01)
*G06N 3/045* (2023.01)

(52) U.S. Cl.
CPC .......... *G06F 3/0613* (2013.01); *G06F 3/0655* (2013.01); *G06F 3/067* (2013.01); *G06F 30/27* (2020.01); *G06N 3/045* (2023.01)

(58) Field of Classification Search
CPC .... G06F 3/0613; G06F 11/3608; G06F 30/27; G06N 3/045; G06N 3/08
See application file for complete search history.

(56) References Cited

U.S. PATENT DOCUMENTS

| | | | | |
|---|---|---|---|---|
| 8,626,791 B1 * | 1/2014 | Lin | ........................ | G06N 20/00 |
| | | | | 707/777 |
| 10,606,722 B2 | 3/2020 | Chen et al. | | |
| 11,275,509 B1 * | 3/2022 | Colgrove | ............ | G06F 11/1076 |
| 2015/0350050 A1 * | 12/2015 | Huang | .................... | H04L 41/40 |
| | | | | 703/21 |
| 2019/0251476 A1 | 8/2019 | Shiebler et al. | | |

(Continued)

OTHER PUBLICATIONS

Dongyang Li et al., "PIPULS: Predicting I/O Patterns Using LSTMS in Storage Systems" (May 2019), 2019 International Conference on High Performance Big Data and Intelligent Systems (HPBD&IS), pp. 14-21 [retrieved from https://ieeexplore.ieee.org/abstract/document/8735467]. (Year: 2019).*

(Continued)

*Primary Examiner* — Brian W Wathen
(74) *Attorney, Agent, or Firm* — Fish & Richardson P.C.

(57) ABSTRACT

Provided are a simulation method and a modeling method. The simulation method includes generating input information regarding a target input/output (I/O) throughput demanded by the user application based on a read request received from a user application and generating output information including an I/O processing rate and a delay time through a neural network by using the input information as an input.

20 Claims, 8 Drawing Sheets

(56)     References Cited

U.S. PATENT DOCUMENTS

| 2020/0034197 A1* | 1/2020 | Nagpal | G06F 9/50 |
| 2020/0065704 A1 | 2/2020 | Nag et al. | |
| 2020/0167671 A1 | 5/2020 | Okada et al. | |
| 2020/0285386 A1* | 9/2020 | Nelogal | G06N 3/0442 |
| 2021/0124878 A1 | 4/2021 | Ravi et al. | |
| 2021/0247997 A1 | 8/2021 | Hoseinzadeh et al. | |
| 2021/0287048 A1 | 9/2021 | Walters et al. | |
| 2022/0350484 A1* | 11/2022 | Vankamamidi | G06F 12/126 |
| 2022/0374169 A1* | 11/2022 | Zuolo | G06F 3/0659 |

OTHER PUBLICATIONS

Molero et al., "Modeling and Simulation of Storage Area Networks" (Aug. 2002), Proceedings 8th International Symposium on Modeling, Analysis and Simulation of Computer and Telecommunication Systems (Cat. No. PR00728), pp. 307-314 [retrieved from https://ieeexplore.ieee.org/abstract/document/876553]. (Year: 2002).*
Schmid et al., "Predicting I/O Performance in HPC Using Artificial Neural Networks" (2016), Supercomputing Frontiers and Innovations, 3 (3). pp. 19-33 [retrieved from https://centaur.reading.ac.uk/77675/]. (Year: 2016).*

* cited by examiner

FIG. 5

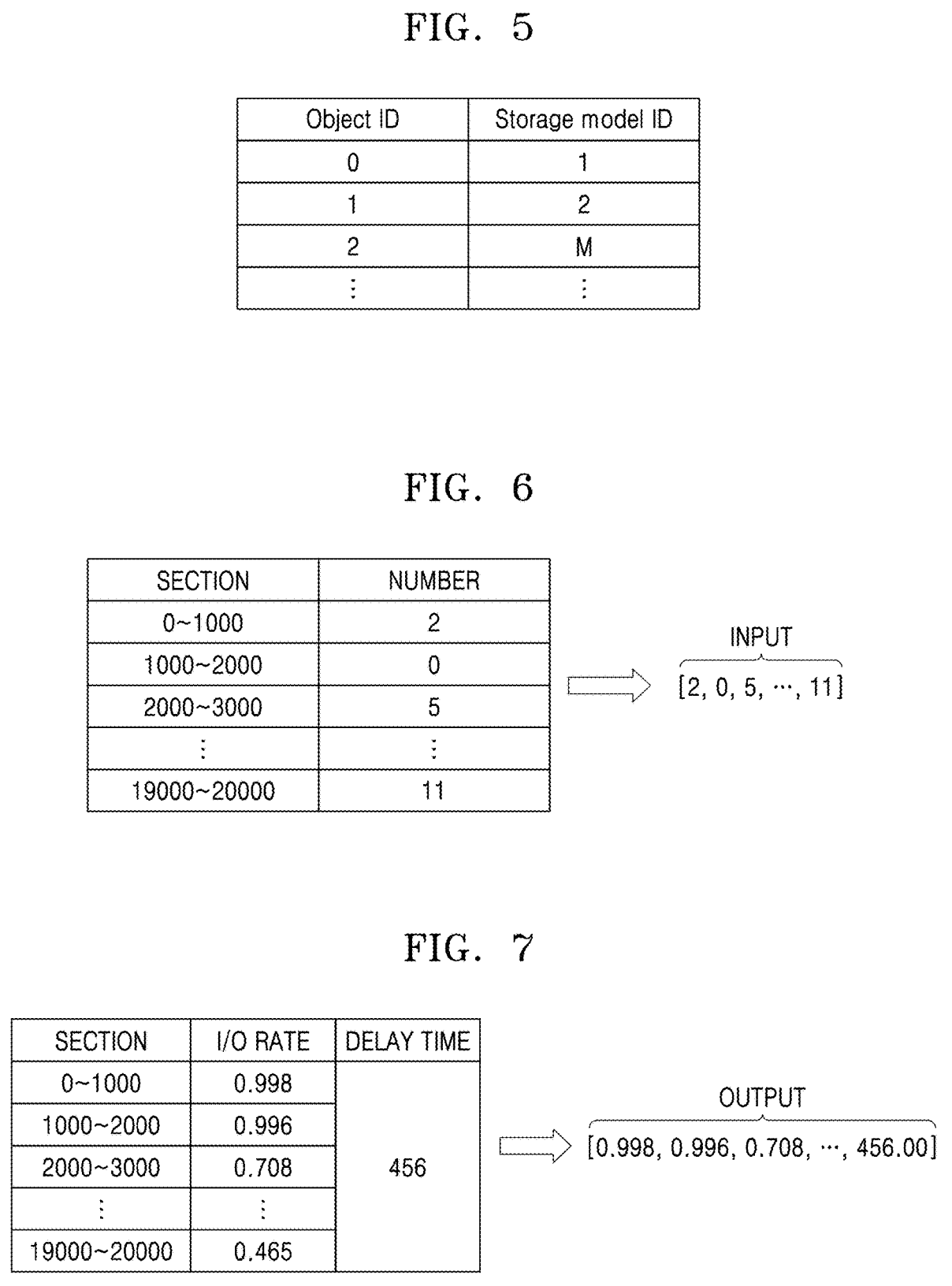

| Object ID | Storage model ID |
|:---------:|:----------------:|
| 0 | 1 |
| 1 | 2 |
| 2 | M |
| ⋮ | ⋮ |

FIG. 6

| SECTION | NUMBER |
|:-------:|:------:|
| 0~1000 | 2 |
| 1000~2000 | 0 |
| 2000~3000 | 5 |
| ⋮ | ⋮ |
| 19000~20000 | 11 |

INPUT

| SECTION | I/O RATE | DELAY TIME |
|:-------:|:--------:|:----------:|
| 0~1000 | 0.998 | |
| 1000~2000 | 0.996 | |
| 2000~3000 | 0.708 | 456 |
| ⋮ | ⋮ | |
| 19000~20000 | 0.465 | |

OUTPUT

START

TRAIN STORAGE MODEL BY USING TRAINING DATA ——S1010

IMPLEMENT TRAINED STORAGE MODEL ——S1020

IMPLEMENT APPLICATION MODEL ——S1030

END

APPLICATION ——1100

RQT/RPN

TRAINER ——1120

RQT          RPN

STORAGE DEVICE ——1110

TD

STORAGE MODEL ——1130

SIMULATION METHOD AND MODELING METHOD

CROSS-REFERENCE TO RELATED APPLICATIONS

This application is based on and claims priority under 35 U.S.C. § 119 to Korean Patent Application Nos. 10-2021-0172379, filed on Dec. 3, 2021, and 10-2022-0064245, filed on May 25, 2022, in the Korean Intellectual Property Office, the disclosures of each of which are incorporated by reference herein in their entireties.

BACKGROUND

The inventive concepts relate to an electronic device, and more particularly, to a simulation method and a modeling method.

Storage devices may be generally classified into an object-based storage device and a block-based storage device according to units by which data is managed. An object-based storage device (hereinafter, referred to as an 'object storage device') is a storage structure that stores and manages data in an object format. An object refers to data that may have any size, e.g., multimedia data like a moving picture or an image and a file, and an object-based storage device may be used to manage objects.

When a designer designs, develops, and validates an object storage device, performance verification and evaluation for simulating the object storage device may be required before the designer builds a test bed for the object storage device. However, it is important to model a simulated model very similar to an actual object storage device and to simulate the simulated model with high accuracy within a short period of time. For example, when object storage is modeled using a neural network and has a change, such as an increase in the number of devices therein, modeling may be used to apply and test a resign to the object storage based on different user requirements.

SUMMARY

The inventive concepts provide a simulation method and a modeling method capable of efficiently simulating a large-scale object storage system by connecting storage models modeled by a deep neural network to an application model in parallel.

According to an aspect of the inventive concepts, there is provided a simulation method including receiving, by the application model, a read request regarding an object from a user application, generating, by the application model, input information regarding a target input/output (I/O) throughput demanded by the user application based on the read request, and generating, using the input information as an input to at least one neural network included in at least one storage model from among a plurality of storage models, output information comprising an I/O processing rate, based on a rate of processed I/O throughput with respect to the target I/O throughput and a delay time, based on a time delay for processing I/O.

According to another aspect of the inventive concepts, there is provided a method, for modeling an object storage system model implemented on a computer, training a storage model based on training data comprising input information and output information, the input information regarding a target input/output (I/O) throughput demanded by a user application and the output information comprising an I/O processing rate based on a rate of a processed I/O throughput with respect to the target I/O throughput and a delay time based on a time delay for processing I/O, and implementing the trained storage model.

BRIEF DESCRIPTION OF THE DRAWINGS

Embodiments of the inventive concepts will be more clearly understood from the following detailed description taken in conjunction with the accompanying drawings in which:

FIG. 5 is a diagram for describing the map table shown in FIG. 2;

FIG. 6 is a diagram for describing input information input to a storage model according to at least one embodiment;

FIG. 7 is a diagram for describing output information output from a storage model according to at least one embodiment;

FIG. 8 is a diagram for describing a first neural network and a second neural network according to at least one embodiment;

DETAILED DESCRIPTION OF THE EMBODIMENTS

Figure 1:
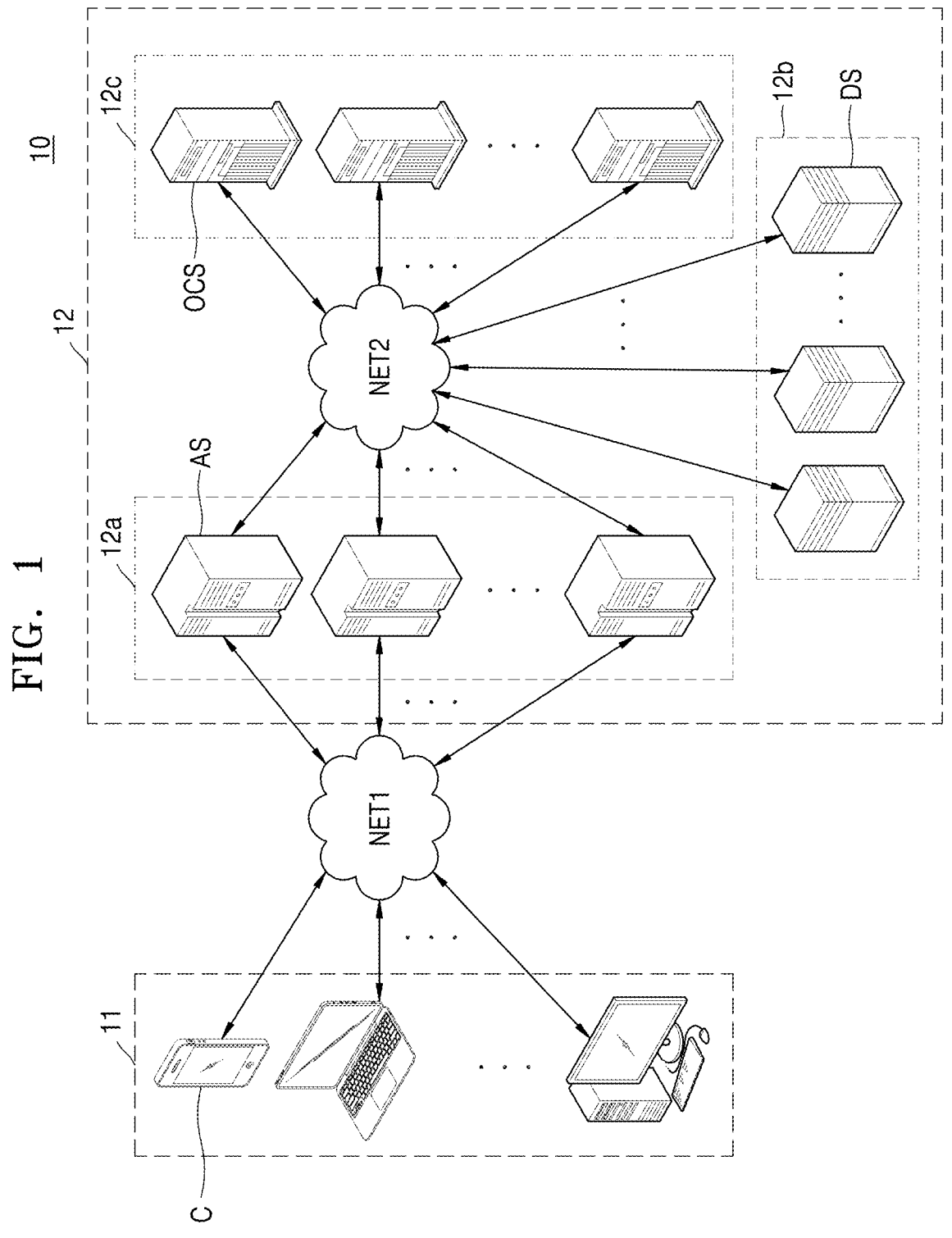
FIG. 1 is a diagram for describing a network system according to at least one embodiment.

Various example embodiments will be described more fully hereinafter with reference to the accompanying drawings, in which some example embodiments are shown. In the drawings, like numerals refer to like elements throughout. The repeated descriptions may be omitted.

In this disclosure, the functional blocks may, unless expressly indicated otherwise, denote elements that process (and/or perform) at least one function or operation and may be included in and/or implemented as processing circuitry such hardware, software, or the combination of hardware and software. For example, the processing circuitry more specifically may include (and/or be included in), but is not limited to, a processor, a Central Processing Unit (CPU), a controller, an Arithmetic Logic Unit (ALU), a digital signal processor, a microcomputer, a Field Programmable Gate Array (FPGA), a System-on-Chip (SoC), a programmable logic unit, a microprocessor, Application-specific Integrated Circuit (ASIC), semiconductor elements in an integrated circuit, circuits enrolled as an Intellectual Property (IP), etc. In some example embodiments, the processing circuitry may include computer-readable program code stored in a computer-readable medium. The computer-readable program code may be provided to a variety of computers or processors of data processing devices. The computer readable media may be, for example, a non-transitory computer readable media. The term "non-transitory," as used herein, is a description of the medium itself (e.g., as tangible, and not a signal) as opposed to a limitation on data storage persistency (e.g., RAM vs. ROM). For example, the computer-readable recording medium may be any tangible medium that can store or include the program in or connected to an instruction execution system, equipment, or device.

The description of the following example embodiments should not be construed as limiting the scope of rights, and it should be construed as belonging to the scope of rights of the embodiments that may be easily inferred by those skilled in the art.

FIG. 1 is a diagram for describing a network system according to at least one embodiment.

Referring to FIG. 1, a network system 10 may include a client group 11 and a data center 12.

The client group 11 may include a plurality of client devices C. The plurality of client devices C may communicate with the data center 12 through a first network NET1, e.g., the Internet. The plurality of client devices C may include, for example, various electronic devices like a smartphone, a smart pad, a laptop computer, a personal computer, a smart camera, a smart TV, etc.

The data center 12 may be a facility that collects various types of data and provides services. The data center 12 may be, include, and/or implement an object storage system. For example, the data center 12 may include an application server group 12a, a database server group 12b, an object cache server group 12c, etc. The application server group 12a, the database server group 12b, and the object cache server group 12c may communicate with one another through a second network NET2, e.g., a local area network (LAN), an intranet, and/or the like.

The application server group 12a may include a plurality of application server devices AS. The plurality of application server devices AS may process a request received from the client group 11 through the first network NET1 and, according to a request of the client group 11, may access the database server group 12b or the object cache server group 12c. For example, the plurality of application server devices AS may store data requested to be stored by the client group 11 in the database server group 12b through the second network NET2. The plurality of application server devices AS may store some of data to be stored in the database server group 12b in the object cache server group 12c through the second network NET2. Also, the plurality of application server devices AS may obtain data requested to be read by the client group 11 from the object cache server group 12c through the second network NET2, and, when there is no requested data in the object cache server group 12c, data requested to be read by the client group 11 may be obtained from the database server group 12b through the second network NET2.

The database server group 12b may include a plurality of database server devices DS. The plurality of database server devices DS may store data processed by the plurality of application server devices AS and provide data to the plurality of application server devices AS according to a request of the plurality of application server devices AS. The plurality of database server devices DS may each provide a non-volatile large-capacity storage.

The object cache server group 12c may include a plurality of object cache server devices OCS. The plurality of object cache server devices OCS may temporarily store data to be stored in the plurality of database server devices DS or data read from the plurality of database server devices DS. The plurality of object cache server devices OCS may function as a cache between the plurality of application server devices AS and the plurality of database server devices DS.

The plurality of object cache server devices OCS may respond to a request of the application server group 12a at a higher response speed than that of the plurality of database server devices DS. In this way, the plurality of object cache server devices OCS may each provide a high-speed storage.

The performance of the database server group 12b or the object cache server group 12c may be generally evaluated as designer models (e.g., models corresponding to an actual device, simulates the model, and measures values of the simulation). To this end, there is need for models corresponding to the actual device modeled very similar to the actual device and to reduce the time taken for simulating a large-scale object storage system.

Figure 2:
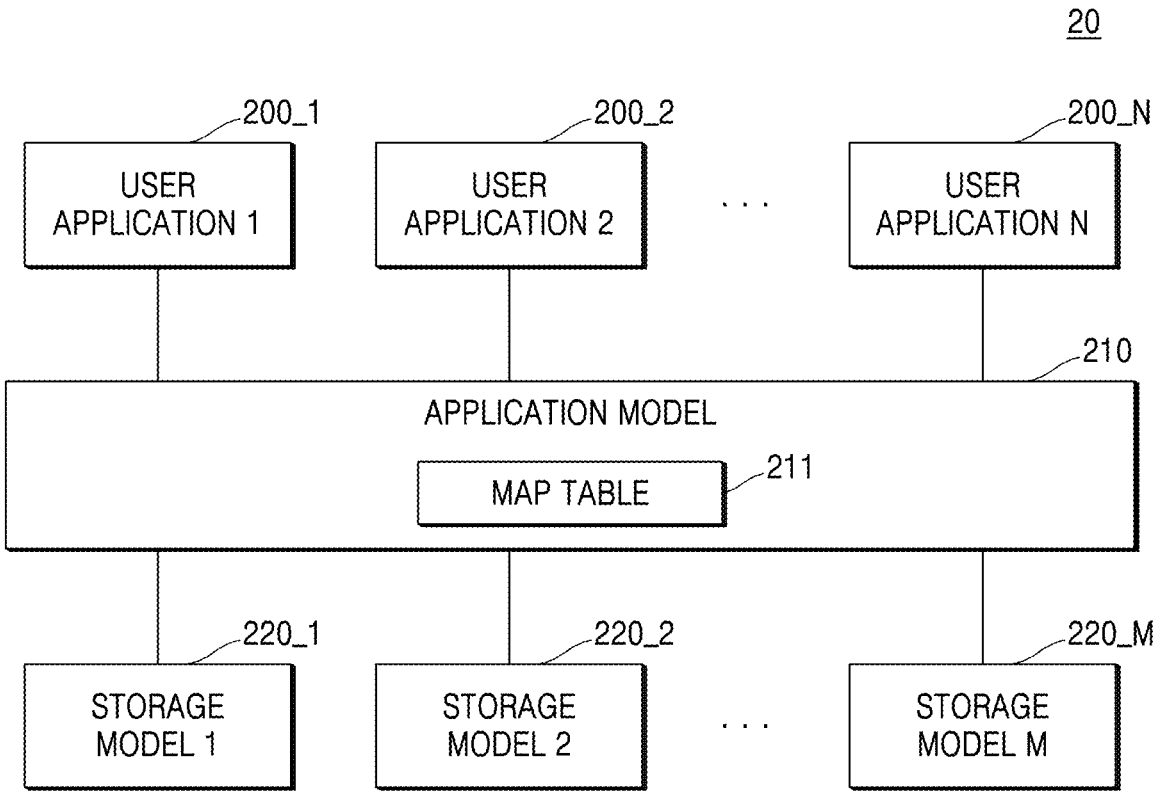
FIG. 2 is a diagram for describing an object storage system model according to at least one embodiment.

FIG. 2 is a diagram for describing an object storage system model according to at least one embodiment.

Referring to FIG. 2, an object storage system model 20 may include a plurality of user applications 200_1, 200_2, . . . , and 200_N, an application model 210, and a plurality of storage models 220_1, 220_2, . . . , and 220_M.

The plurality of user applications 200_1, 200_2, . . . , and 200_N may be actual user applications and/or models of actual user applications and may output a request for accessing a storage model. For example, the first user application 200_1 may output a read request for an object. In this case, an output throughput of the read request may be up to a target input/output (I/O) throughput. In this case, the I/O throughput may be referred to as input/output operations per second (IOPS). Each user application may output a request for each of two or more storage models. For example, the first user application 200_1 may output a first read request for the first storage model 220_1 and a second read request for the second storage model 220_2. The number of user applications may be 2 or more, and N may be 2 or a greater integer. However, according to some other embodiments, a single user application may be included in the object storage system model 20.

The application model 210 may be a model of an application that is configured to control an actual object storage device. The application model 210 may provide requests provided from the plurality of user applications 200_1, 200_2, . . . , and 200_N to the plurality of storage models 220_1, 220_2, . . . , and 220_M, respectively, based on a map table 211. The application model 210 may be connected to the plurality of user applications 200_1, 200_2, . . . , and 200_N in parallel. Also, the plurality of user applications 200_1, 200_2, . . . , and 200_N may be connected to the plurality of storage models 220_1, 220_2, . . . , 220_M in parallel.

The map table 211 may include a mapping relationship between object IDs and storage model IDs of storage models storing objects respectively corresponding to the object IDs. Since a particular object is stored in a particular storage, a read request for the particular request needs to be provided to a storage storing the particular object. The application model 210 may provide a particular read request to a particular storage model by using the map table 211.

The plurality of storage models 220_1, 220_2, . . . , and 220_M may be models of actual object storage devices. An object storage device may be a device that manages data object-by-object. The plurality of storage models 220_1, 220_2, . . . , and 220_M may each store one or more objects. For example, the first storage model 220_1 may store a first object. However, the inventive concepts are not limited thereto. The plurality of storage models 220_1, 220_2, . . . , and 220_M may receive a read request provided from the application model 210 and output an object in response to the read request. Also, the number of storage models may be two (2) or more, and M may be 2 or a greater integer. However, according to some other embodiments, a single storage model may be included in the object storage system model 20.

According to at least one embodiment, the application model 210 may generate input information including, e.g., a target I/O throughput based on a read request provided from the plurality of user applications 200_1, 200_2, . . . , and 200_N and provide the input information to the plurality of storage models 220_1, 220_2, . . . , and 220_M. For example, assuming that the first object is stored in the first storage model 220_1, the application model 210 may generate input information including a target I/O throughput for the first object based on a read request for the first object and provide the input information to the first storage model 220_1.

According to at least one embodiment, the plurality of storage models 220_1, 220_2, . . . , and 220_M may each be used as an object cache device and/or an object cache system. For example, the plurality of storage models 220_1, 220_2, . . . , and 220_M may each be an object cache server device OCS shown in FIG. 1. However, the inventive concepts are not limited thereto, and, according to some embodiments, the plurality of storage models 220_1, 220_2, . . . , and 220_M may each be used as any device or system that manages data object-by-object. Also, according to some embodiments, the plurality of storage models 220_1, 220_2, . . . , and 220_M are not limited to server devices and may be implemented as memory modules and/or storage modules.

According to at least one embodiment, the plurality of storage models 220_1, 220_2, . . . , and 220_M may each include at least one neural network. Each storage model may generate output information by processing the input information provided from the application model 210 as an input, through the at least one neural network. According to at least one embodiment, the output information may include an I/O throughput ratio and a delay time. The I/O throughput ratio may be a ratio of processed I/O throughput to the target I/O throughput. For example, the I/O throughput ratio may be expressed as a "processed I/O throughput/target I/O throughput". The delay time may include a delay in processing I/O.

According to at least one embodiment, since the plurality of storage models 220_1, 220_2, . . . , and 220_M are connected to the application model 210, the plurality of storage models 220_1, 220_2, . . . , and 220_M in parallel, one or more storage models from among the plurality of storage models 220_1, 220_2, . . . , and 220_M may generate the output information by using the output information of one (or more) of the other storage models. As described above, as the plurality of storage models 220_1, 220_2, . . . , and 220_M are connected to the application model 210 in parallel, a large amount of data samples output from respective storage models may be secured within a short period of time, simulation of a storage system (e.g., the object storage system model 20) may be performed quickly, and a small number of errors may occur as compared to an actual storage device.

Figure 3:
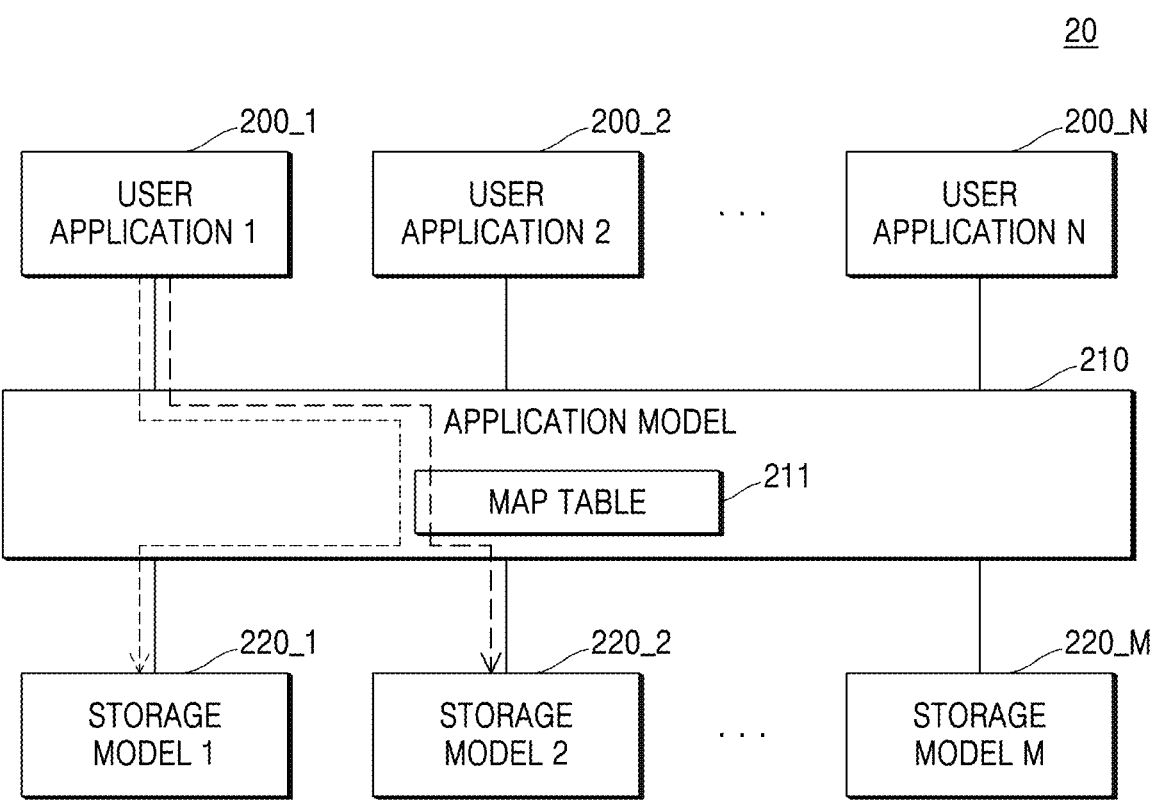
FIG. 3 is a diagram for describing a read request in the object storage system model shown in FIG. 2.

FIG. 3 is a diagram for describing a read request in the object storage system model shown in FIG. 2.

Referring to FIG. 3, according to at least one embodiment, the plurality of user applications 200_1, 200_2, . . . , and 200_N may each output two or more read requests. For example, the two more read requests may include instructions that a first object be stored in the first storage model 220_1 and a second object be stored in the second storage model 220_2. In this case, the first user application 200_1 may output a first read request for the first object and a second read request for the second object.

The application model 210 may check object IDs of objects respectively corresponding to the two or more read requests. For example, the application model 210 may check the object ID of the first object and the object ID of the second object. The application model 210 may check the storage model IDs respectively corresponding to the object IDs in the map table 211. For example, in the map table 211, the object ID of the first object may be mapped to the storage model ID of the first storage model 220_1 and the object ID of the second object may be mapped to the storage model ID of the second storage model 220_2. The application model 210 may provide a read request to a storage model corresponding to a checked storage model ID. For example, the application model 210 may transmit a first read request to the first storage model 220_1 and transmit a second read request to the second storage model 220_2.

Figure 4:
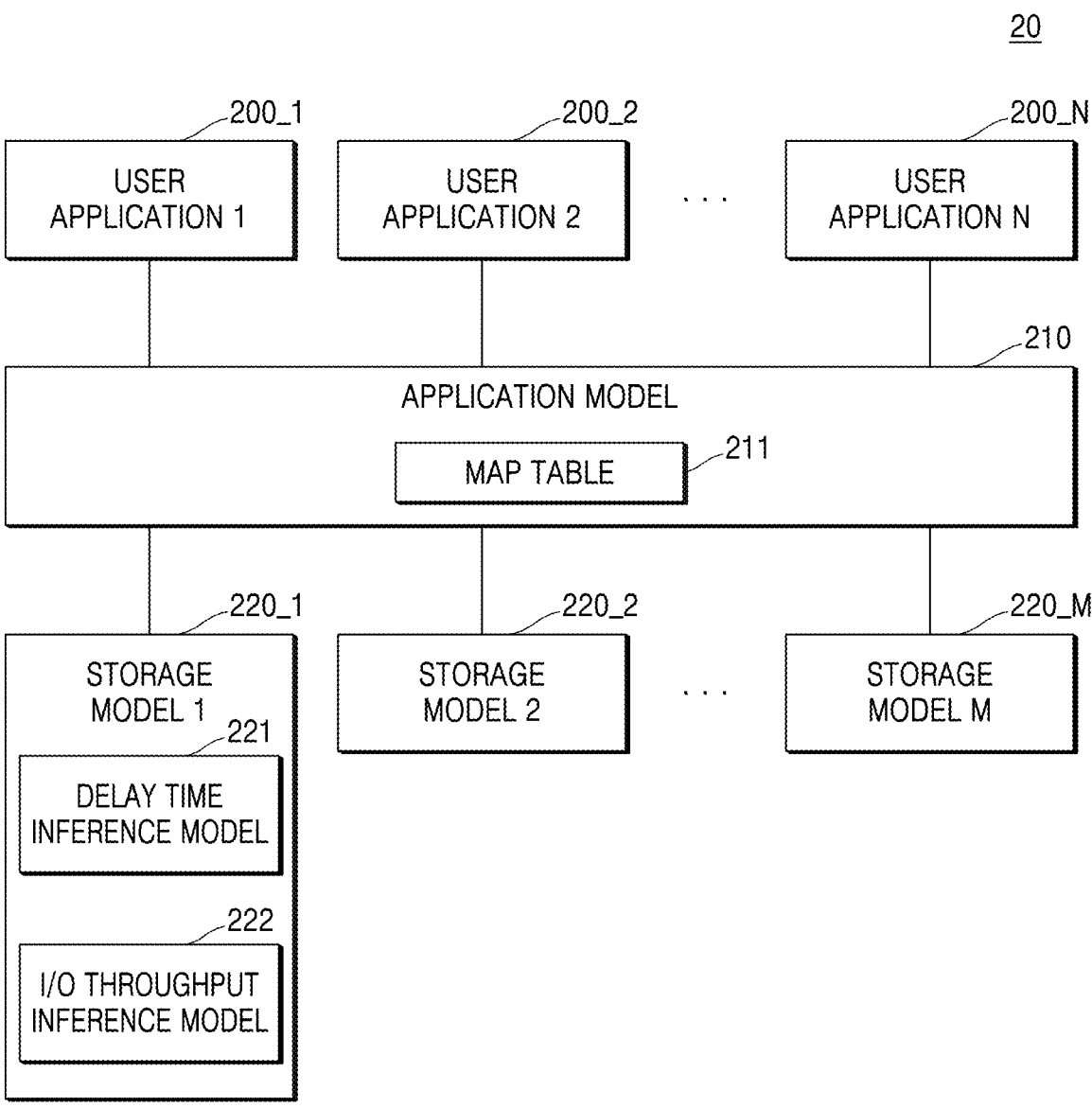
FIG. 4 is a diagram for describing an embodiment of a storage model in the object storage system model shown in FIG. 2.

FIG. 4 is a diagram for describing at least one embodiment of a storage model in the object storage system model shown in FIG. 2.

Referring to FIG. 4, the plurality of storage models 220_1, 220_2, . . . , and 220_M may each include at least one machine learning model for inferring I/O throughput that may be handled by a corresponding storage model and a delay time of the corresponding storage model. For example, the first storage model 220_1 may include a delay time inference model 221 and an I/O throughput inference model 222; and/or each of second to M-th storage models 220_2, . . . , and 220_M may also include the delay time inference model 221 and the I/O throughput inference model 222.

The delay time inference model 221 may use a first neural network to infer delay time as an output by using the input information, described above, as an input. For example, according to at least one embodiment, the delay time inference model 221 may infer a delay time at a second time point after a first time point based on a target I/O throughput received at the first time point, during a pre-set unit time step. The unit time step may be, for example, a time unit between several seconds and several minutes.

The I/O throughput inference model 222 may use a second neural network to infer I/O throughput as an output by using the input information, described above, as an input. According to at least one embodiment, the I/O throughput inference model 222 may infer a processed I/O throughput at a second time point based on a target I/O throughput received at a first time point, during a unit time step.

The delay time and the I/O throughput may be inferred according to Equation 1 below.

$$\text{for } S_i = 1, \ldots, N_s: \left( SIOPS_{S_i}^t, RT_{S_i}^t \right) \leftarrow nProfiler\left( RIOPS_{S_i}^{t+e} \right) \quad \text{[Equation 1]}$$

t denotes time, RT denotes a delay time, RIOPS denotes a target I/O throughput, SIOPS denotes an I/O throughput (or processed I/O throughput), and s, denotes an input state.

The first neural network and the second neural networks may each include, for example, deep learning, ResNet, Convolutional Neural Network (CNN), Recurrent Neural Network (RNN), a region with CNN (R-CNN), a region proposal network (RPN), a stacking-based deep neural network (S-DNN), a state-space dynamic neural network (S-SDNN), a deconvolution network, a deep belief network (DBN), a restricted Boltzmann machine (RBM), a fully convolutional network, a long short-term memory (LSTM)

network, a classification network, a Bayesian Neural Network (BNN) and/or the like. Additionally (and/or alternatively), the deep learning model(s) may be trained based on at least one of various algorithms such as regression, linear and/or logistic regression, random forest, a support vector machine (SVM), and/or other types of models, such as statistical clustering, Bayesian classification, decision trees, dimensionality reduction such as principal component analysis, expert systems, combinations thereof including ensembles such as random forests, and/or the like.

The delay time inference model 221 and the I/O throughput inference model 222 may be trained (and/or learn) based on training data including input information and output information as described above. An embodiment of learning and modeling the delay time inference model 221 and the I/O throughput inference model 222 is described below with reference to FIGS. 10 and 11.

FIG. 5 is a diagram for describing the map table shown in FIG. 2.

Referring to FIGS. 2 and 5, the map table 211 may include a mapping relationship between object IDs and storage model IDs. For example, an object ID 0 may be mapped to a storage model ID 1, an object ID 1 may be mapped to a storage model ID 2, and an object ID 2 may be mapped to a storage model ID M.

The mapping relationship between object IDs and storage model IDs may indicate that an object having a mapped object ID is stored in a storage model having a mapped storage model ID. For example, when the storage model ID of the first storage model 220_1 is 1, an object having the object ID 0 may be stored in the first storage model 220_1. In another example, when the storage model ID of the second storage model 220_2 is 2, an object having the object ID 1 may be stored in the second storage model 220_2. However, the inventive concepts are not limited thereto.

In an embodiment, the application model 210 may receive a read request. Next, the application model 210 may identify a storage model ID of a storage model storing an object from among the plurality of storage models 220_1, 220_2, . . . , and 220_M based on the map table 211. Next, the application model 210 may provide input information to a storage model corresponding to a checked storage model ID.

FIG. 6 is a diagram for describing input information input to a storage model according to an embodiment.

Referring to FIGS. 2, 3, and 6, the application model 210 may receive read requests respectively received from the plurality of user applications 200_1, 200_2, . . . , and 200_N as much as target I/O throughputs demanded by the respective user applications 200_1, 200_2, . . . , and 200_N. The application model 210 may generate a vector including target I/O throughputs provided from the respective user applications 200_1, 200_2, . . . , and 200_N as input information. However, since a vector of input information including requests for all objects has a very large size, the performance of a neural network applied to each storage model may be deteriorated. Therefore, more concise input information is needed.

According to at least one embodiment, the application model 210 may count the number of user applications having a target I/O throughput belonging to a corresponding I/O throughput section among pre-set a plurality of I/O throughput sections for the corresponding I/O throughput section, based on target I/O throughputs of the plurality of user applications 200_1, 200_2, . . . , and 200_N. For example, the plurality of I/O throughput section may be divided into a first throughput section (e.g., 0-1000), a second throughput section (e.g., 1001-2000), etc. For example, according to at least one embodiment, the number of I/O throughput sections may be a value obtained by dividing a pre-set (or otherwise determined) maximum target I/O throughput by a pre-set (or otherwise determined) section size. For example, the pre-set maximum target I/O throughput is illustrated as 20,000 and the pre-set section size is 1,000. In this case, the number of I/O throughput sections may be twenty (20). However, the inventive concepts are not limited thereto.

For example, the first user application 200_1 may provide a read request for a first object as much as a first target I/O throughput, the second user application 200_2 provides a read request for the first object as much as a second target I/O throughput. When both the first target I/O throughput and the second target I/O throughput are included in the first I/O throughput section, the number of user applications included in the first I/O throughput section is 2 and the number of user applications included in the second I/O throughput section is 0. When first target I/O throughputs are included in the first I/O throughput section and second target I/O throughputs are included in the second I/O throughput section, the number of user applications included in the first I/O throughput section is 1, and the number of user applications included in the second I/O throughput section is 1.

With reference to FIG. 6, for example, the pre-set maximum target I/O throughput is 20,000, the section size is 1,000, and the number of I/O throughput sections is 20. In this case, the number of user applications included in an I/O throughput section from 0 to 1000 may be 2, the number of user applications included in an I/O throughput section from 1000 to 2000 may be 0, the number of user applications included in an I/O throughput section from 2000 to 3000 may be 5, and the number of user applications included in an I/O throughput section from 19000 to 20000 may be 11. However, the inventive concepts are not limited thereto.

According to at least one embodiment, the application model 210 may generate a vector including numbers counted for respective corresponding I/O throughput sections as input information. Referring to FIG. 6, for example, a vector including counted numbers in the example above may be a vector [2, 0, 5, . . . , 11], and the vector [2, 0, 5, . . . , 11] may be provided to a corresponding storage model as input information.

According to the at least one embodiment described above, the performance of a neural network applied to each storage model may be prevented from being deteriorated by simplifying the input information.

FIG. 7 is a diagram for describing output information output from a storage model according to at least one embodiment.

Referring to FIG. 7, the plurality of storage models 220_1, 220_2, . . . , and 220_M may infer I/O processing rates corresponding to the number of I/O throughput sections by using a neural network. For example, each storage model may infer an I/O processing rate for each I/O throughput section. For example, with reference to FIG. 7, the first storage model 220_1 may infer I/O processing rates for the I/O throughput section from 0 to 1000, the I/O throughput section from 1000 to 2000, the I/O throughput section from 2000 to 3000, and the I/O throughput section from 19000 to 20000 as 0.998, 0.996, 0.708, and 0.456, respectively. However, the inventive concepts are not limited thereto.

The plurality of storage models 220_1, 220_2, . . . , and 220_M may infer one delay time by using a neural network. Referring to FIG. 7, for example, the delay time may be 456 μs, but is not limited thereto.

The plurality of storage models 220_1, 220_2, . . . , and 220_M may generate a vector including the plurality of I/O processing rates (e.g., 0.998, 0.996, 0.708, . . . , and 0.456) and one delay time (e.g., 456 μs) as output information. Elements of above the vector may be [0.998, 0.996, 0.708, . . . , 0.456, 456.00].

The application model 210 may provide output information provided from the plurality of storage models 220_1, 220_2, . . . , and 220_M to the plurality of user applications 200_1, 200_2, . . . , and 200_N.

According to the embodiment described above, a large-scale object storage system may be efficiently simulated.

Figure 8:
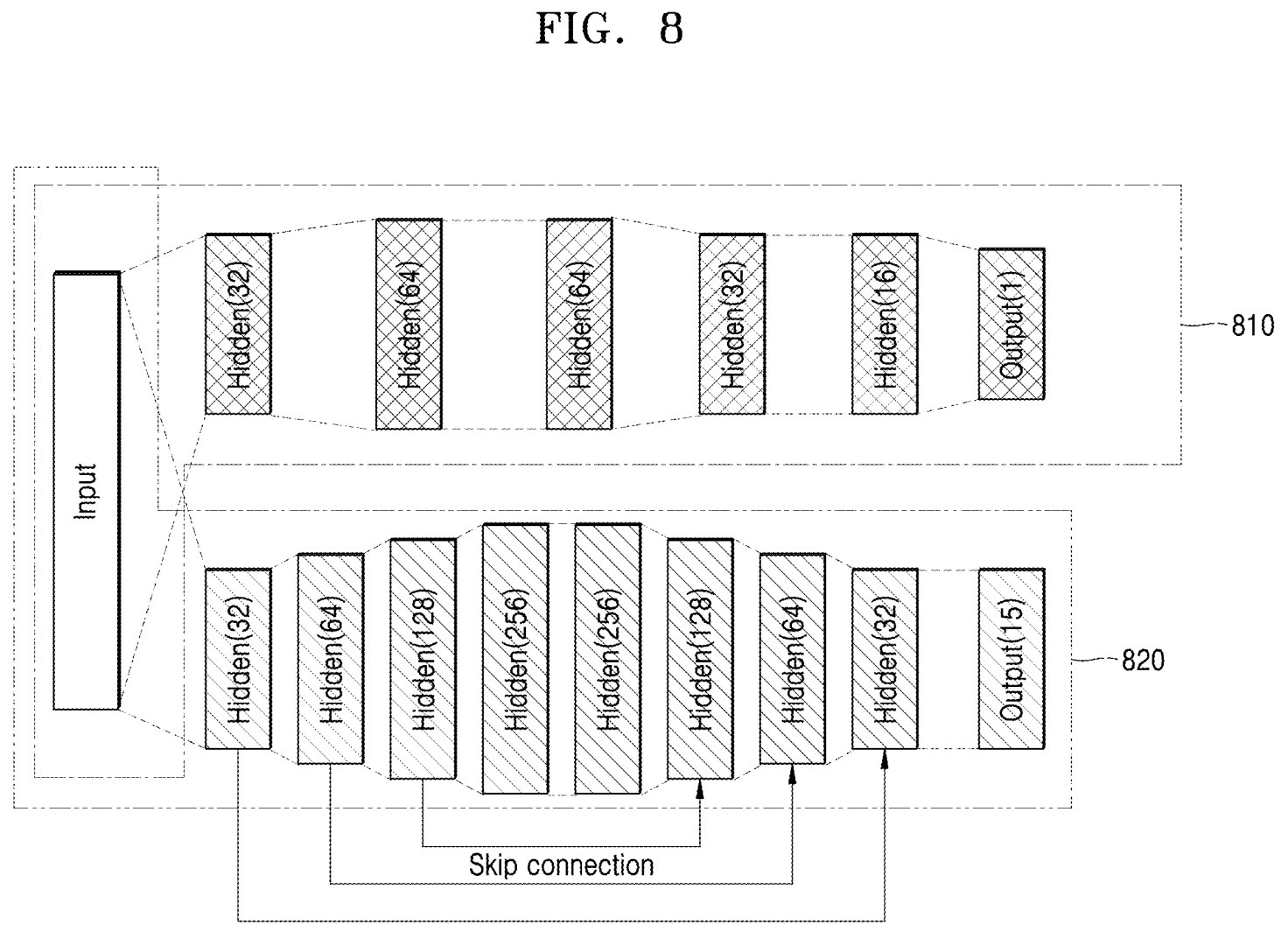

FIG. 8 is a diagram for describing a first neural network and a second neural network according to at least one embodiment.

Referring to FIG. 8, each storage model may include a first neural network 810 and a second neural network 820.

The first neural network 810 may include an input layer (Input shown in FIG. 8) that receives input information, a plurality of hidden layers ("Hidden" shown in FIG. 8), and an output layer (Output(1) shown in FIG. 8) that outputs delay time. For example, the delay time may be output through the first neural network 810.

The second neural network 820 may include an input layer (Input shown in FIG. 8) that receives input information, a plurality of hidden layers (Hidden shown in FIG. 8), and an output layer (Output(15) shown in FIG. 8) that outputs an I/O processing rate. For example, the I/O processing rate may be output through the second neural network 820.

In an embodiment, a function applied to the layers included in each of the first neural network 810 and the second neural network 820 may be a mish activation function. However, the inventive concepts are not limited thereto.

In an embodiment, a skip connection (Skip connection shown in FIG. 8) may be applied between layers included in each of the first neural network 810 and the second neural network 820. However, the inventive concepts are not limited thereto.

The first neural network 810 and the second neural network 820 may be trained by using training data including the input information and the output information described above with reference to FIGS. 6 and 7. For example, the first neural network 810 and the second neural network 820 may be trained based on supervised learning, (e.g., a method of analyzing or extracting data characteristics of input data with label information and may utilize a neural network structure by learning (or training) based on the input data with label information to generate prediction models) and/or unsupervised learning (e.g., a method of analyzing or extracting data characteristics of input data without label information, which may utilize, e.g., an autoencoder (AE) structure).

Figure 9:
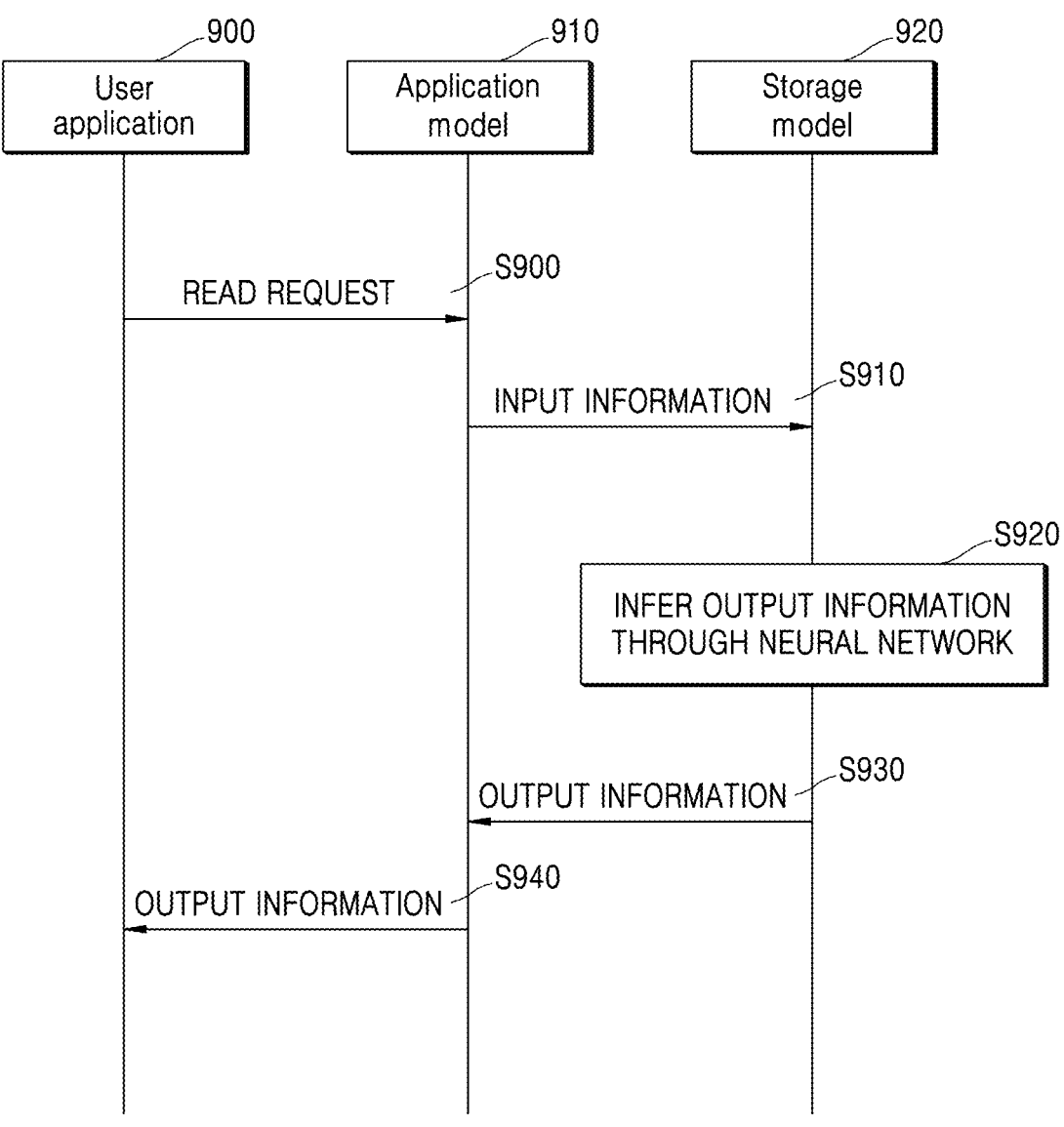
FIG. 9 is a diagram for describing a simulation method according to at least one embodiment.

FIG. 9 is a diagram for describing a simulation method according to at least one embodiment.

Referring to FIG. 9, for example, a simulation method according to at least one embodiment may be implemented on a computer. In at least one example embodiment, the simulation method may be executed on (or by) a computer program stored in a computer-readable recording medium.

In operation S900, a user application 900 may transmit a read request regarding an object. The user application 900 may correspond to any one of the plurality of user applications 200_1, 200_2, . . . , and 200_N shown in FIG. 2.

In operation S910, an application model 910 may generate input information regarding a target I/O throughput demanded by the user application 900, based on the read request, and transmit the input information to a storage model 920. Here, the application model 910 may correspond to the application model 210 shown in FIG. 2 and/or the storage model 920 may correspond to any one of the plurality of storage models 220_1, 220_2, . . . , and 220_M shown in FIG. 2. The input information may be the same as that described above with reference to FIG. 6.

According to at least one embodiment, when a plurality of storage models 920 are provided and the application model 910 includes a map table as described above with reference to FIGS. 2 and 5, the application model 910 may check a storage model ID based on the map table and provide input information to a storage model corresponding to a checked storage model ID. The present at least one embodiment may be the same as and/or substantially similar to the at least one embodiment described above with reference to FIGS. 2, 3, and 5.

According to at least one embodiment, when a plurality of user applications 900 are provided, the application model 910 may receive read requests provided from the plurality of user applications as much as target I/O throughputs respectively demanded by the plurality of user applications, count the number of user applications having a target I/O throughput belonging to a corresponding I/O throughput section among pre-set a plurality of I/O throughput sections for the corresponding I/O throughput section, based on target I/O throughputs of the plurality of user applications 200_1, 200_2, . . . , and 200_N, and generate a vector including numbers counted for respective corresponding I/O throughput sections as input information. The present embodiment may be the same as and/or substantially similar to the embodiment described above with reference to FIGS. 2 and 6.

In operation S920, the storage model 920 may generate output information by using the input information as an input through a neural network. The output information may include at least one I/O processing rate and one delay time as described above with reference to FIG. 7.

According to at least one embodiment, when a plurality of I/O throughput sections are set, the storage model 920 may infer an I/O throughput rate for each corresponding I/O throughput section and generate a vector including a plurality of I/O processing rates corresponding to the number of I/O throughput sections and one delay time. The present embodiment may be the same and/or substantially similar to as the embodiment described above with reference to FIG. 7.

According to at least one embodiment, the neural network may include the first neural network 810 and the second neural network 820 described above with reference to FIG. 8.

In operation S930, the storage model 920 may transmit the output information to the application model 910.

In operation S940, the application model 910 may transmit the output information to the user application 900.

According to the embodiment described above, a large-scale object storage system may be efficiently simulated by connecting storage models modeled by a deep neural network to an application model in parallel.

Also, according to the embodiment described above, the simulation time may be reduced by simulating an object storage system based on a neural network.

Figure 10:
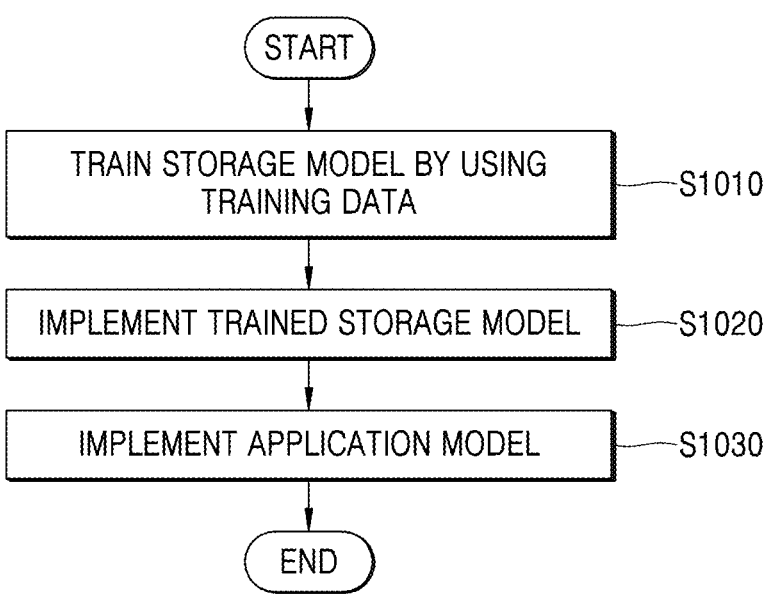
FIG. 10 is a diagram for describing a modeling method according to at least one embodiment.

FIG. 10 is a diagram for describing a modeling method according to an embodiment.

Referring to FIG. 10, a modeling method according to an embodiment may be implemented on a computer.

In operation S1010, an operation of training a storage model by using training data is performed. The training data may include the input information and the output information described above with reference to FIGS. 6 and 7.

According to at least one embodiment, in operation S1010, the first neural network 810 described above with reference to FIG. 8 may be trained, and the second neural network 820 described above with reference to FIG. 8 may be trained.

In operation S1020, an operation of implementing a trained storage model is performed.

According to at least one embodiment, in operation S1020, the delay time inference model 221 including the first neural network 810 may be implemented, and the I/O throughput inference model 222 including the second neural network 820 may be implemented.

In operation S1030, an operation of implementing an application model is performed.

According to at least one embodiment, the implemented application model 210 may, for example, control a read operation of an actual storage device based on a result (e.g., determined by one of the storage models 220_1 through 220_M acting in parallel) with the highest I/O processing rate and/or the lowest delay time. For example, in at least one embodiment the implemented application model 210 may be employed in the data center 12 of FIG. 1 to participate in the assignment of object storage (e.g., may generate commands including instructions for the assignment and/or migration of objects in the data center 12), and/or the object storage system model 20 may provide a configuration and/or update for improving I/O processing rate and/or the delay time, and/or may instruct the actual devices being modeled to update the configuration of the actual devices based on the results determined by at least one of the storage models 220_1 through 220_M acting in parallel.

For example, in at least one embodiment, the operations S1020 and S1030 may also include updating the application model 210 and/or at least one of the storage models 220_1 through 220_M by periodically comparing the output of actual devices to the output of the application model 210 and/or at least one of the storage models 220_1 through 220_M, and re-training the application model 210 and/or at least one of the storage models 220_1 through 220_M when the accuracy of the application model 210 and/or at least one of the storage models 220_1 through 220_M falls outside a tolerance range.

According to at least one embodiment, the modeling method may further include obtaining a target I/O throughput, a processed I/O throughput, and a delay time from a user application and an object storage device. The target I/O throughput may be obtained from the user application. Also, the processed I/O throughput and the delay time may be obtained from the object storage. The object storage device may be an actual storage device described above. The present embodiment is described below with reference to FIG. 11.

According to at least one embodiment, the modeling method may further include generating training data to be input to a storage model based on the target I/O throughput, the processed I/O throughput, and the delay time. Since the training data includes input information, as described above with reference to FIG. 6, in the generating of the training data, based on a target I/O throughput, the number of user applications having a target I/O throughput belonging to a corresponding I/O throughput section among pre-set a plurality of I/O throughput sections may be counted for the corresponding I/O throughput section, based on target I/O throughputs of the plurality of user applications 200_1, 200_2, . . . , and 200_N, and a vector including numbers counted for respective corresponding I/O throughput sections may be generated as input information. Also, since the training data includes output information, in the generating of the training data, an I/O processing rate may be calculated for each corresponding I/O throughput section, and a vector including a plurality of I/O processing rates corresponding to the number of I/O throughput sections and one delay time may be generated as output information. The present embodiment is described below with reference to FIG. 11.

The modeling method described above may be executed on (and/or by) a computer program stored in a computer-readable recording medium.

Figure 11:
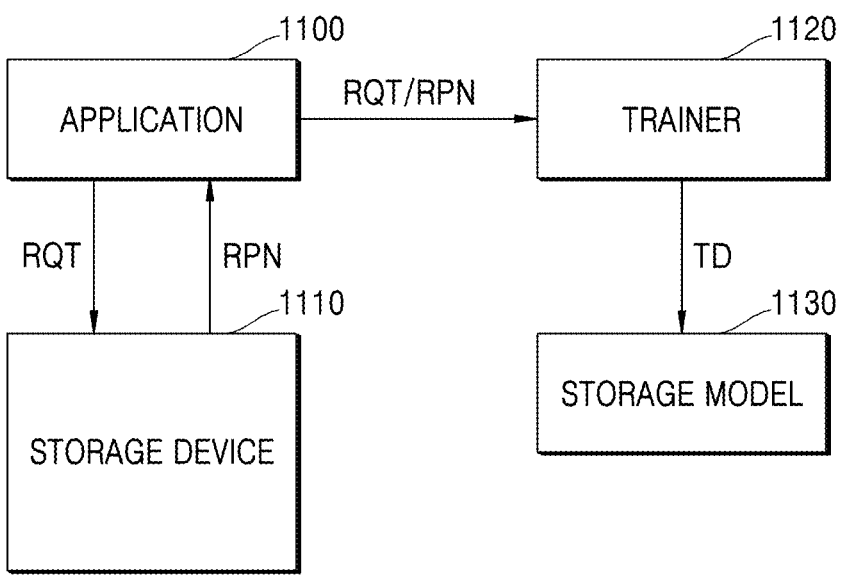
FIG. 11 is a diagram for describing a training method according to at least one embodiment.

FIG. 11 is a diagram for describing a training method according to at least one embodiment.

Referring to FIG. 11, an application 1100 may correspond to the user application stated above. The application 1100 may be implemented by, for example, a flexible I/O tester (FIO), a Ceph, or a Docker. The application 1100 may provide a request RQT regarding an object to a storage device 1110 as much as a target I/O throughput. The request RQT may be, for example, a read request.

The storage device 1110 may be an object storage device. The storage device 1110 may provide a response RPN to the request RQT to the application 1100. The response RPN may include a processed I/O throughput and a delay time.

The application 1100 may provide a request/response RQT/RPN to a trainer 1120. The request/response RQT/RPN may include a target I/O throughput, a processed I/O throughput, a delay time, and identification information (e.g., id) of the application 1100.

The trainer 1120 may generate input information based on the target I/O throughput. The input information is the same as that described above with reference to FIG. 6. Also, the trainer 1120 may generate output information based on the target I/O throughput, the processed I/O throughput, and the delay time. The output information is the same as that described above with reference to FIG. 7. In addition, the trainer 1120 may generate training data TD including the input information and the output information and provide the training data TD to a storage model 1130. The storage model 1130 may be trained by using the training data TD.

According to the embodiment described above, a large-scale object storage system may be efficiently simulated.

While the inventive concepts have been particularly shown and described with reference to embodiments thereof, it will be understood that various changes in form and details may be made therein without departing from the spirit and scope of the following claims.

What is claimed is:

1. A simulation method, implemented on a computer, to simulate an object storage system model comprising a plurality of storage models and an application model connected to the plurality of storage models in parallel, the simulation method comprising:

receiving, by the application model, a read request regarding an object from a user application;

generating, by the application model, input information regarding a target input/output (I/O) throughput demanded by the user application based on the read request; and generating, using the input information as an input to at least one neural network included in at least one storage model from among the plurality of storage models, output information comprising an I/O processing rate, based on a rate of a processed I/O throughput with respect to the target I/O throughput and a delay time, based on a time delay for processing I/O.

2. The simulation method of claim 1, wherein the application model comprises a map table indicating a mapping relationship between object IDs and storage model IDs of storage models, of the plurality of storage models, storing objects corresponding to the object IDs, the generating the input information includes identifying, based on the map table, a storage model ID of at least one storage model to store the object requested by the user application, and the input information is provided to a storage model corresponding to an identified storage model ID.

3. The simulation method of claim 1, wherein the generating the input information includes receiving a plurality of read requests from a plurality of user applications, the plurality of read requests including a plurality of target I/O throughputs respectively demanded by the plurality of user applications, and further comprising counting a number of user applications having respective target I/O throughput, of the plurality of target I/O throughputs, belonging to a corresponding I/O throughput section, among a plurality of I/O throughput sections, based on the plurality of target I/O throughputs of the plurality of user applications, and generating a vector as at least part of the input information, the vector based on a result of counting the number of user applications having the target I/O throughput belonging to the corresponding I/O throughput section.

4. The simulation method of claim 3, wherein a number of the plurality of I/O throughput sections correspond to a value obtained by dividing a maximum target I/O throughput by a section size.

5. The simulation method of claim 3, wherein the generating the output information includes inferring the I/O processing rate for each corresponding I/O throughput section, and the output information includes a vector comprising a plurality of I/O processing rates corresponding to a number of the plurality of I/O throughput sections and one delay time.

6. The simulation method of claim 1, wherein the at least one neural network of the at least one storage model comprises a first neural network comprising an input layer configured to receive the input information and an output layer configured to output the delay time, and a second neural network comprising an input layer configured to receive the input information and an output layer configured to output the I/O processing rate, the generating the output information includes outputting the delay time through the first neural network, and the I/O processing rate through the second neural network.

7. The simulation method of claim 1, wherein the generating the output information includes inferring, during a unit time, the processed I/O throughput and the delay time at a second time point after a first time point based on a target I/O throughput received at the first time point.

8. The simulation method of claim 1, wherein a function applied to at least one layer included in the at least one neural network comprises a mish activation function.

9. The simulation method of claim 1, wherein the at least one neural network includes a skip connection between layers.

10. A method for modeling an object storage system model implemented on a computer, the method comprising:

training a storage model based on training data comprising input information and output information, the input information regarding a target input/output (I/O) throughput demanded by a user application and the output information comprising an I/O processing rate based on a rate of a processed I/O throughput with respect to the target I/O throughput and a delay time based on a time delay for processing I/O; and implementing the trained storage model.

11. The method of claim 10, further comprising:

obtaining the target I/O throughput, the processed I/O throughput, and the delay time from the user application and an object storage device; and generating the training data based on the target I/O throughput, the processed I/O throughput, and the delay time.

12. The method of claim 11, wherein, the target I/O throughput is obtained from a read request provided by the user application for the object storage device, and the processed I/O throughput and the delay time are obtained from the object storage device.

13. The method of claim 12, wherein the user application is one of a plurality of user applications, and generating the training data includes counting, based on a plurality of target I/O throughputs of the plurality of user applications, a number of user applications having respective target I/O throughputs, of the plurality of target I/O throughputs, belonging to a corresponding I/O throughput section among a plurality of I/O throughput sections, and generating a first vector as at least part of the input information, the first vector based on a result of counting the number of user applications having the target I/O throughput belonging to the corresponding I/O throughput section.

14. The method of claim 13, wherein, the generating the training data includes determining the I/O processing rate for each corresponding I/O throughput section, and the output information includes a second vector comprising a plurality of I/O processing rates corresponding to a number of the plurality of I/O throughput sections and one delay time.

15. The method of claim 10, wherein the training the storage model includes training a first neural network, the first neural network comprising an input layer configured to receive the input information and an output layer configured to output the delay time, and training a second neural network, the second neural network comprising an input layer configured to receive the input information and an output layer configured to output the I/O processing rate.

16. The method of claim 15, wherein the implementing the trained storage model includes implementing a delay time inference model comprising the first neural network, and implementing an I/O throughput inference model comprising the second neural network.

17. The method of claim 15, wherein a function applied to at least one layer included in at least one of the first neural network or the second neural network is a mish activation function.

18. The method of claim 17, wherein at least one of the first neural network and the second neural network includes a skip connection between layers.

19. The method of claim 10, further comprising:

implementing an application model connected to the trained storage model.

20. A non-transitory computer-readable recording medium including computer-executable instructions, which when executed by processing circuitry, cause an apparatus including the processing circuitry to perform the simulation method of claim 1.

\* \* \* \* \*